(12) United States Patent
Yang et al.

(10) Patent No.: US 10,622,771 B2
(45) Date of Patent: Apr. 14, 2020

(54) POWER MODULES FOR POWER DISTRIBUTION ASSEMBLIES

(71) Applicant: Hamilton Sundstrand Corporation, Charlotte, NC (US)

(72) Inventors: Nhia Yang, Loves Park, IL (US); Jeffrey T. Wavering, Rockford, IL (US); Steven E. Jackson, Rockford, IL (US); Robert C. Cooney, Janesville, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/125,191

(22) Filed: Sep. 7, 2018

(65) Prior Publication Data

US 2020/0083655 A1  Mar. 12, 2020

(51) Int. Cl.
*H01R 25/16* (2006.01)
*H01R 12/71* (2011.01)

(52) U.S. Cl.
CPC ......... *H01R 25/161* (2013.01); *H01R 12/716* (2013.01)

(58) Field of Classification Search
CPC .......................... H01R 25/161; H01R 12/716
USPC .......................................................... 439/78
See application file for complete search history.

(56) References Cited

U.S. PATENT DOCUMENTS

| | | | | |
|---|---|---|---|---|
| 3,750,083 A * | 7/1973 | Fayling | ................. | A47J 39/006 219/495 |
| 5,012,390 A * | 4/1991 | Erbele | ..................... | H05K 1/14 361/775 |
| 5,980,311 A * | 11/1999 | Campbell | ............ | H01R 33/945 361/668 |
| 6,036,508 A * | 3/2000 | Anderson | .......... | H01R 12/7088 439/80 |
| 6,372,998 B1 * | 4/2002 | Suzuki | ............... | H01R 43/0256 174/258 |
| 6,433,281 B1 * | 8/2002 | Miyajima | ................ | H02G 3/16 174/149 B |
| 6,560,123 B1 * | 5/2003 | de Varennes | .......... | H01H 73/08 174/208 |
| 6,561,844 B1 * | 5/2003 | Johnson | ................. | G01R 11/04 439/507 |

(Continued)

FOREIGN PATENT DOCUMENTS

| | | |
|---|---|---|
| EP | 2645826 A2 | 10/2013 |
| EP | 3024307 A1 | 5/2016 |
| WO | 2017081245 | 5/2017 |

OTHER PUBLICATIONS

Extended European search report issued in corresponding EP application No. 19196038.4, dated Feb. 5, 2020.

*Primary Examiner* — Alexander Gilman
(74) *Attorney, Agent, or Firm* — Locke Lord LLP; Scott D. Wofsy; Georgi Korobanov

(57) ABSTRACT

A bus bar for a printed wiring board assembly has a distribution portion and a supply portion. The supply portion has a socket contact that is in electrical communication with the distribution portion without an intervening joint portion to limit electrical resistance between a supply plug seated in the socket contact and the distribution portion of the bus bar. Printed wiring board assemblies, power distribution assemblies, and methods of making printed distribution assemblies are also described.

16 Claims, 6 Drawing Sheets

(56) References Cited

U.S. PATENT DOCUMENTS

| | | | | |
|---|---|---|---|---|
| 6,722,926 B2* | 4/2004 | Chevassus-More | ............................ | H01R 13/113 |
| | | | | 439/721 |
| 7,165,979 B1* | 1/2007 | Oka | ........................ | H05K 3/306 |
| | | | | 439/381 |
| 7,952,024 B2* | 5/2011 | Okushita | ................... | H02G 5/02 |
| | | | | 174/68.2 |
| 8,154,380 B2* | 4/2012 | Miller | ..................... | G01R 15/18 |
| | | | | 338/334 |
| 8,182,299 B2* | 5/2012 | Schrader | ................ | H01R 13/18 |
| | | | | 439/839 |
| 8,693,169 B2* | 4/2014 | Diaz | ....................... | H02B 1/056 |
| | | | | 361/627 |
| 8,881,481 B2* | 11/2014 | Myers | ..................... | E04B 9/006 |
| | | | | 52/506.08 |
| 8,986,030 B2* | 3/2015 | Billman | ................... | H02G 5/02 |
| | | | | 439/249 |
| 9,166,309 B1* | 10/2015 | Costello | ................ | H01R 25/161 |
| 9,190,756 B2* | 11/2015 | Glick | ..................... | H01R 13/18 |
| 9,200,867 B1* | 12/2015 | Swan | ..................... | F41G 11/003 |
| 9,257,804 B1* | 2/2016 | Beck | ..................... | H01R 25/142 |
| 9,331,448 B2* | 5/2016 | Jeon | ...................... | H01R 43/24 |
| 9,716,356 B2* | 7/2017 | Hsieh | ..................... | H01R 24/70 |
| 10,050,394 B2* | 8/2018 | Aporius | .............. | H01R 12/7088 |
| 2007/0057130 A1* | 3/2007 | Nikayin | ................. | H02G 3/126 |
| | | | | 248/216.1 |
| 2007/0108963 A1 | 5/2007 | Wavering et al. | | |
| 2010/0302729 A1 | 12/2010 | Tegart et al. | | |

* cited by examiner

POWER MODULES FOR POWER DISTRIBUTION ASSEMBLIES

BACKGROUND OF THE INVENTION

1. Field of the Invention

The present disclosure relates to power distribution systems, and more particularly to bus bars for printed wiring board assemblies in power distribution systems.

2. Description of Related Art

Electrical systems, such as on aircraft, commonly employ switches to control the flow of power to various loads requiring power. Power is generally supplied to the switches by a power bus, which is electrically connected to the various switches. In some electrical systems, such as in high current electrical systems, the switches are grouped on a card. The card seats in a card cage, generally in a backplane, and routes power via the switches to various electrical devices. Fastened joint typically electrically connect the card to a bus bar or cable.

Fastened joints allow the tightness of the joint to be controlled during assembly by torqueing the fasteners to a predetermined load. Joint tightness in turn can be monitored during service by inspecting the joint and fastener pre-load. Since the tightness of the fasteners is typically a good indicator of joint resistance to current flowing between the module bus bar and the supply bus bar, resistance can thereby be controlled. The fastened joints require assembly when the card cage is constructed. Fastened joints also require disassembly when a card requires service or replacement during the lifetime of card and card cage.

Such conventional methods and systems have generally been considered satisfactory for their intended purpose. However, there is still a need in the art for improved printed wiring board assemblies, methods of making printed wiring boards, and bus bars for printed wiring board assemblies. The present disclosure provides a solution for this need.

SUMMARY OF THE INVENTION

A bus bar for a printed wiring board assembly has a distribution portion and a supply portion. The supply portion has a socket contact that is in electrical communication with the distribution portion without an intervening joint portion to limit electrical resistance between a supply plug seated in the socket contact and the distribution portion of the bus bar.

In certain embodiments the socket contact can define a plug receptacle with an aperture. The aperture can be located on an end of the supply portion opposite the distribution portion. The plug receptacle can taper in width between the aperture and an interior of the socket contact. A foil body can be disposed within the plug receptacle for electrically connecting the socket contact with a supply plug. An insulator body can be coupled to the bus bar for electrically insulating the bus bar from the external environment.

In accordance with the certain embodiments the distribution portion can be angled relative to the supply portion. The bus bar can have an L-shaped body defined by the distribution portion and the supply portion of the bus bar. The supply portion and the socket contact can have a length that is smaller than a length of the distribution portion. A socket standoff can be co-located with the socket contact on an end of the supply portion for mounting the bus bar to a printed wiring board (PWB) body.

It is contemplated that the distribution portion can have a first tab and a second tab. The first tab can connect the second tab electrically in series with the socket contact. The second tab can have an electrical cross-section that is smaller than an electrical cross-section of the first tab. A first terminal can extend from the first tab for supplying electrical power to a solid-state switch device. A second terminal can extend from the second tab for supplying electrical power to a solid-state switch device. One or more solid-state switch devices can be connected to the bus bar.

It is also contemplated that, in accordance with certain embodiments, a standoff portion can be connected electrically in series with the socket contact by the second tab. A first standoff can be arranged on a side of the distribution portion opposite the supply portion for mounting the bus bar to a PWB body. A second standoff can be arranged on a side of the first standoff opposite the distribution portion for mounting the bus bar to the PWM body. An intermediate standoff can be arranged on the supply portion between the socket portion and the distribution portion of the bus bar for mounting the bus bar to a PWB body. The distribution portion can include a spine portion extending along at least the second tab to stiffen a PWB assembly including the bus bar.

A PWB assembly includes a PWB body with a tab end and a backplane end. A bus bar as described above is mounted to the PWB body. The socket contact is arranged at the backplane end of the PWB body for mating the socket connect with a supply plug in a power distribution assembly chassis.

In certain embodiments the bus bar can have an L-shaped body defined by the distribution portion and the supply portion of the bus bar, the supply portion and the socket contact can have a length that is smaller than a length of the distribution portion, and the socket contact can define a plug receptacle having an aperture located on an end of the supply portion opposite the distribution portion. The plug receptacle can taper in width between the aperture and an interior of the socket contact.

In accordance with certain embodiments the distribution portion of the bus bar can have a first tab and a second tab, the first tab connecting the second tab electrically in series with the socket contact, and the second tab having an electrical cross-section that is smaller than an electrical cross-section of the first tab. A first terminal can extend from the first tab, a second terminal can extend from the second tab, and a standoff portion can be connected electrically in series with the socket contact by the second tab.

It is also contemplated that, in accordance with certain embodiments, a first standoff can be arranged on a side of the distribution portion opposite the supply portion for mounting the bus bar to a PWB body, a second standoff can be arranged on a side of the first standoff opposite the distribution portion for mounting the bus bar to the PWM body, an intermediate standoff can be arranged on the supply portion between the socket and distribution portions for mounting the bus bar to a PWB body, and a socket contact standoff can be co-located with the socket contact on an end of the supply portion of the bus bar for mounting the bus bar to a PWB body. The distribution portion can include a spine portion extending along at least the second tab to stiffen the PWB assembly.

A power distribution assembly with a chassis and a backplane. A supply plug is located in the backplane of the chassis. A PWB as described above is slidably received within the chassis. The supply plug seated in the socket contact such that the distribution portion of the bus is in electrical communication with the supply plug without the use of fasteners between the bus bar and the backplane.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
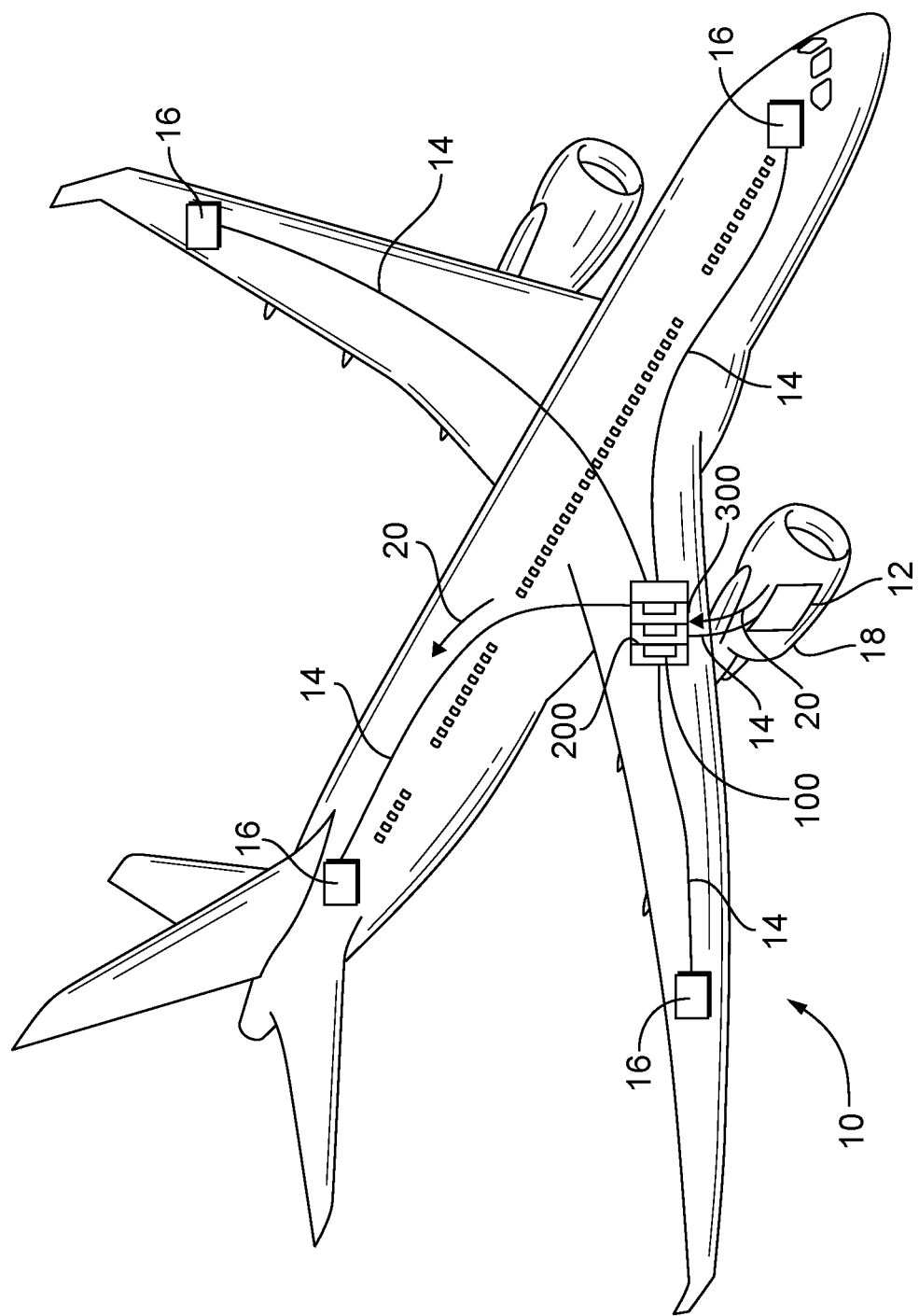
FIG. 1 is a schematic view of an exemplary embodiment of an electrical system having a bus bar constructed in accordance with the present disclosure, showing the bus bar mounted to a printed wiring board (PWB) assembly and arranged within a power distribution assembly to selectively connect a power source with a various electrical loads.

Reference will now be made to the drawings wherein like reference numerals identify similar structural features or aspects of the subject disclosure. For purposes of explanation and illustration, and not limitation, a partial view of an exemplary embodiment of a bus bar for a printed wiring board (PWB) assembly in accordance with the disclosure is shown in FIG. 1 and is designated generally by reference character 100. Other embodiments of PWB assemblies, power distribution assemblies, and methods of making power distribution assemblies in accordance with the disclosure, or aspects thereof, are provided in FIGS. 2-6, as will be described. The systems and methods described herein can be used for power distribution systems in vehicles, such as in aircraft, though the present disclosure is not limited to aircraft.

Referring to FIG. 1, an electrical system 10, e.g., an aircraft electrical system, is shown. Electrical system 10 includes a generator 12, a power bus 14, and a plurality of electrical loads 16. Generator 12 is operably associated with an engine 18, e.g., an aircraft main engine or auxiliary power unit, and is arranged to provide a flow of electrical power 20 to power bus 14. Power bus 14 is connected to respective electrical loads 16 through bus bar 100, which is mounted to a PWB assembly 200 slidably received within a power distribution assembly 300. Although an aircraft electrical system is shown in the illustrated exemplary embodiment, it is to be understood and appreciated that electrical systems in other types of vehicles as well as non-vehicular applications can also benefit from the present disclosure.

Figure 2:
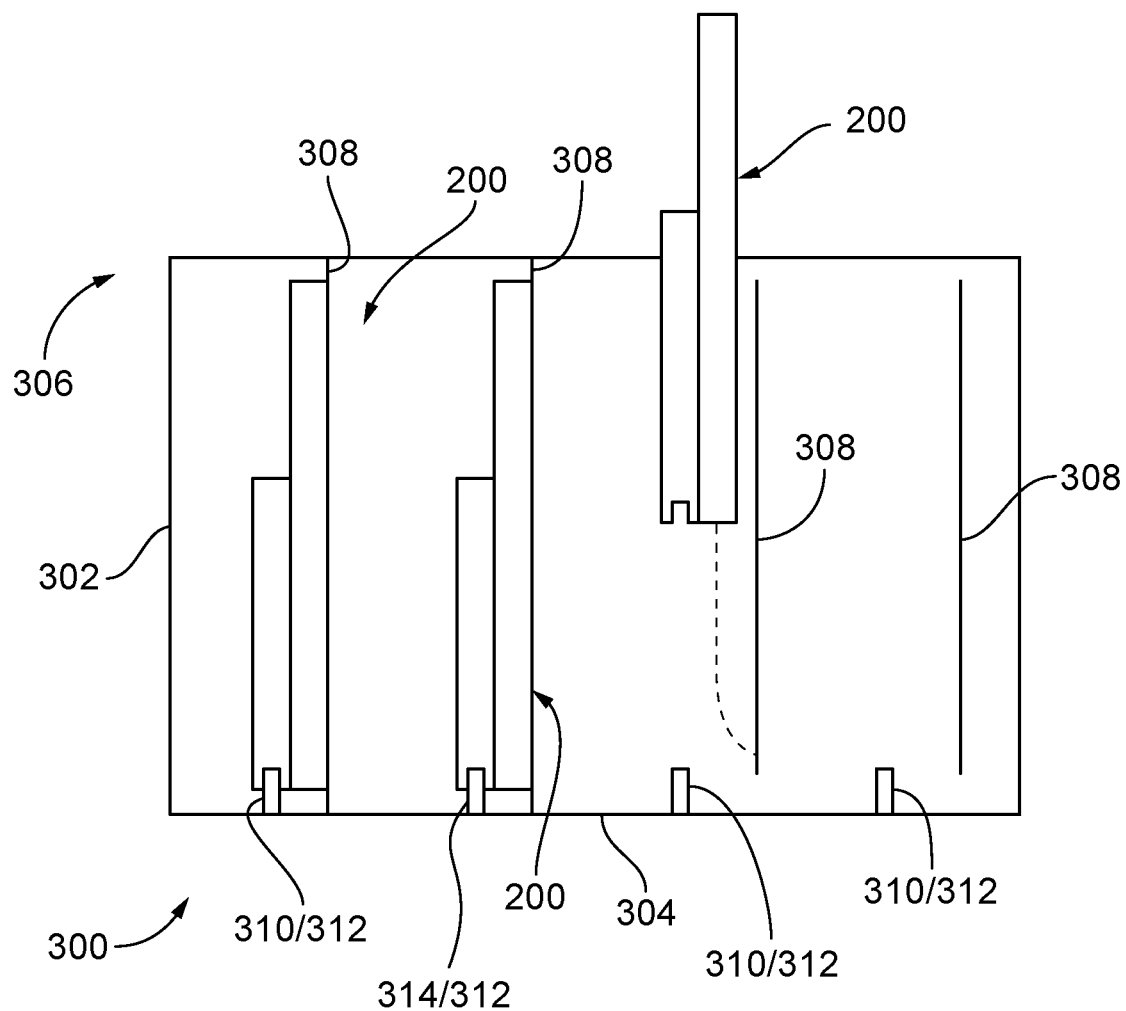
FIG. 2 is a schematic view of the power distribution assembly of FIG. 1, showing a plurality of PWB assemblies slidably received within a chassis of the power distribution assembly and electrically connected to supply plugs without fastened joints.

With reference to FIG. 2, power distribution assembly 300 is shown. Power distribution assembly 300 includes a chassis 302, a backplane 304, and a plurality of PWB assemblies 200. Chassis 302 has a service end 306 arranged on an end of chassis 302 opposite backplane 304 with a plurality of card slots 308 extending between service end 306 and backplane 304. Respective PWB assemblies 200 are slidably received within chassis 302 in respective card slots 308, which are laterally spaced apart from one another between service end 306 and backplane 304. Supply plugs 310 located on backplane 304 are connected to respective PWB assemblies 200 to provide electrical power 20 (shown in FIG. 1) to a respective bus bar 100 mounted on each PWM assembly 200. Optionally, signal connectors 312 located on backplane end 206 connect to solid-state switch devices 202 (shown in FIG. 3) to electrically open and close solid-state switch devices 202 according to the operational requirements of electrical loads 16 (shown in FIG. 1).

Figure 3:
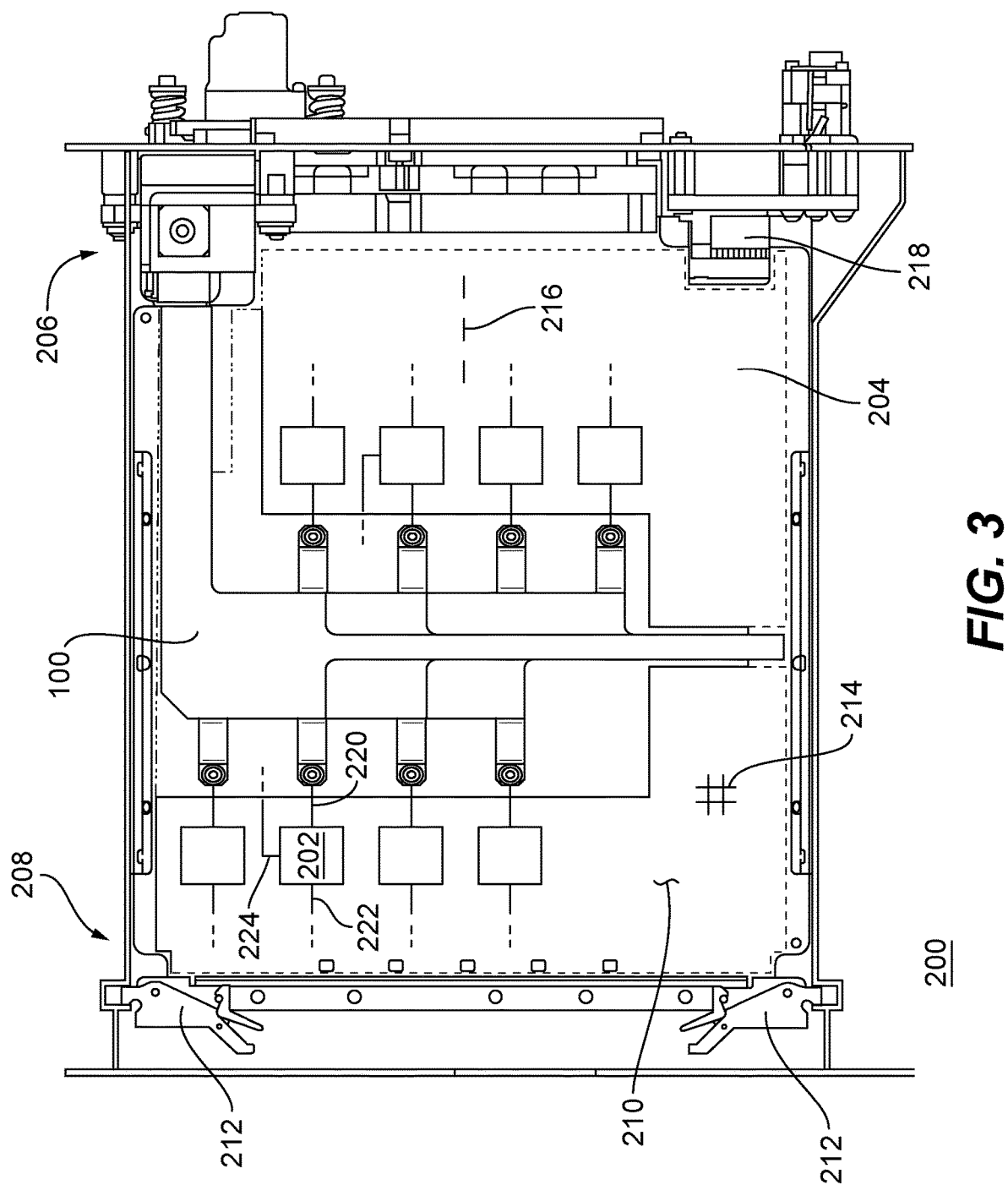
FIG. 3 is a plan view of the PWB assembly of FIG. 1, showing the bus bar and solid-state switch devices mounted to a PWB body of the PWB assembly and a signal connector in communication with the solid-state switch devices.

With reference to FIG. 3, PWB assembly 200 is shown. PWB assembly 200 includes a PWB body 204 with a tab end 208, an opposite backplane end 206, and a mounting surface 210. Tabs 212 mounted on tab end 208 are configured and adapted for fixing PWB assembly 200 to service end 306 (shown in FIG. 2) of power distribution assembly 300 (shown in FIG. 2). PWB body 204 is constructed on an electrically insulating material 214, such as glass or FR-4, and includes within its interior one or more wiring trace 216 to provide electrical communication through PWM body 204 formed from an electrically conductive material. As will be appreciated by those of skill in the art in view of the present disclosure, internal wiring traces reduce (or eliminate entirely) the need cabling, simplifying assembly of power distribution assembly 100. Bus bar 100 is mounted to PWB body 204 on mounting surface 210 such that a socket contact 102 of bus bar 100 is located at backplane end 206 adjacent to a signal connector 218.

Solid-state switch devices 202 are mounted on mounting surface 210 of PWB body 204. Each solid state switch device 202 includes an input lead 220, an output lead 222, and a gate lead 224. Input lead 220 is electrically connected to bus bar 100 for receiving electrical power 20 (shown in FIG. 1) from bus bar 100. Output lead 222 is electrically connected to a respective electrical loads 16 (shown in FIG. 1), such as through a subsystem feed lead or wiring trace 216. Gate lead 224 is electrically connected to signal connector 218 for receiving open/close commands therethrough, in response to which output lead 222 is electrically disconnected and electrically connected to input lead 220 according to the needs of the electrical load 16 (shown in FIG. 1) connected to output lead 222.

Connection of gate lead 224 can be via a discrete lead and/or wiring trace 216, as suitable for an intended application. Solid-state switch devices 202 can be MOSFET solid-state switch devices, IGBT solid-state switch devices, or a combination MOSFET and IGBT solid-state switch devices. In the illustrated exemplary embodiment PWB assembly 200 includes eight (8) solid-state switch devices, which allows power distribution assembly 200 (shown in FIG. 2) to be sized such that power distribution 200 can serve as a drop-in replacement or upgrade in a legacy electrical system. As will be appreciated by those of skill in the art in view of the present disclosure, PWM assembly 200 can include more than eight or fewer than eight solid-state switch devices, as suitable for an intended application. As will also be appreciated by those of skill in the art in view of the present disclosure, PWB assembly 200 can also include transistor devices and/or electromechanical devices such as contactors, as suitable for an intended application.

Figure 4:
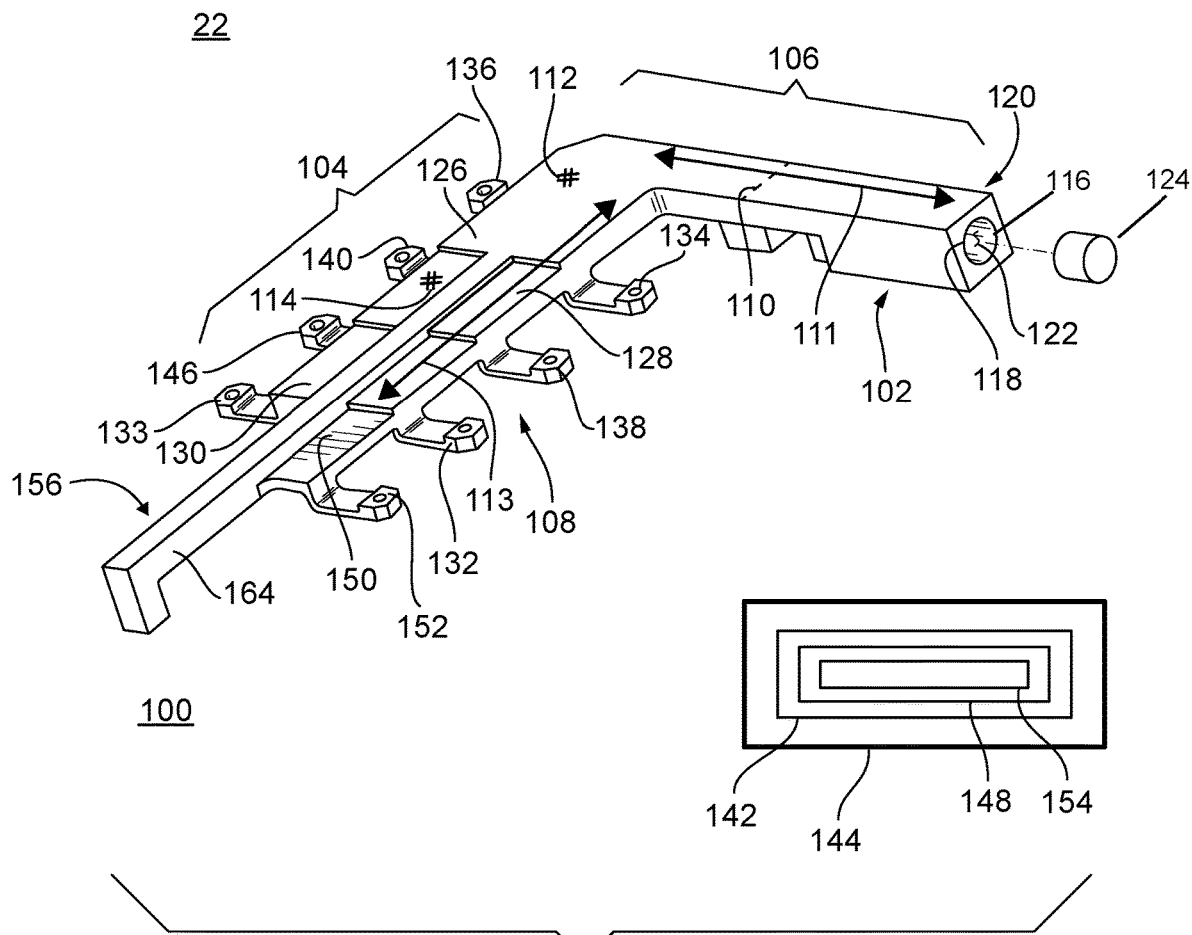
FIGS. 4 and 5 are a perspective views of outer surface and PWB surfaces of the bus bar of FIG. 1, showing an L-shaped body having a supply portion and a distribution portion, the supply portion having a socket contact and the distribution portion having a plurality of tabs and terminals for providing power to solid-state switch devices.

With reference to FIG. 4, a perspective view of the top surface of bus bar 100 is shown. Bus bar 100 has a distribution portion 104 and a supply portion 106. Socket contact 102 is located on supply portion 106 and is in electrical communication with distribution portion 104 without an intervening joint portion 110 (shown in dashed outline) to limit electrical resistance between supply plug 310 (shown in FIG. 2) seated in socket contact 102 and distribution portion 104 of bus bar 100.

As shown in FIG. 4 bus bar 100 has an L-shaped body 108. L-shaped body 108 facilitates packaging PWB assembly 200 in power distribution assembly 300 (shown in FIG. 1), providing compactness of the bus bar/PWB body arrangement. As will be appreciated by those of skill in the art in view of the present disclosure other shapes are possible within the scope of the present disclosure.

Bus bar 100 includes an electrically conductive material 112. Electrically conductive material 112 monolithically defines supply portion 106 and distribution portion 104. Supply portion 106 and socket contact 102 have a length 111 that is smaller than a length 113 of distribution portion 104, and are angled relative to distribution portion 104. In the illustrated exemplary embodiment supply portion 106 and socket contact 102 are angled at about 90 degrees to one another, e.g., are orthogonal, relative to distribution portion 104. This limits the size of PWB body 204 (shown in FIG. 3) required to support bus bar 100 to that appropriate for solid-state switch devices 202 (shown in FIG. 3) and allow socket contact 102 extend longitudinally along PWB body 204. Optionally, an insulator body 114 can be coupled to bus bar 100, overlaying electrically conductive material 112 and electrically isolating bus bar 100 from the external environment 22.

Socket contact 102 is monolithic in construction and defines a plug receptacle 116 with an aperture 118. Aperture 118 and plug receptacle 116 are configured and adapted to removably seat supply plug 310 (shown in FIG. 2). Aperture 118 is located on an end 120 of supply portion 106 opposite distribution portion 104. Plug receptacle 116 tapers in width between aperture 118 and an interior 122 of socket contact 102. Optionally, a foil body 124 can be disposed within plug receptacle 116 for electrically connecting socket contact 102 with supply plug 310 (shown in FIG. 2).

Distribution portion 104 has a plurality of tabs, i.e., tab portions with terminations. As shown in FIG. 4 distribution portion 104 has a first tab 126, a second tab 128, and a spine portion 164 extending along distribution portion 104. Spine portion 164 spans at least second tab 128 to provide additional stiffness to PWM body 204. First tab 126 is connected to supply portion 106 and has extending therefrom a termination 134, a termination 136, and a termination 140. Termination 134, termination 136, and termination 140 are configured for connection to input leads of solid-state switch devices 202 (shown in FIG. 2), and are connected electrically in series with supply portion 106 through first tab 136. First tab 126 has an electrical cross-section 144 that corresponds, e.g. is substantially equivalent, to an electrical cross-section of supply portion 106.

Second tab 128 is connected to first tab 126 on a side of first tab opposite supply portion 106 and has extending therefrom a termination 138 and a termination 146. Termination 138 and termination 146 are connected electrically in series with supply portion 106 through second tab 128 and first tab 126. Second tab has an electrical cross-section 142 that is smaller than an electrical cross-section 144 of first tab 126, distribution portion 104 being is stepped in electrical cross-sectional area in a way that corresponds to current flow through distribution portion 104, i.e., one tab having lower current flow than another tab having a smaller electrical cross-section. The stepped electrical cross-sectional area limits weight of bus bar 100 by exploiting the reduction in amount of current carried by distribution portion 104 by successive tabs of distribution portion 104, e.g., second tab 128 having a smaller electrical cross-section than that of first tab 126.

In the illustrated exemplary embodiment distribution portion 104 has four (4) tabs. In this respect distribution portion 104 has a third tab 130 and a fourth tab 150. Third tab 130 has a termination 132 and a termination 133. Termination 132 and termination 133 are connected in series with supply portion 106 through second tab 128 and first tab 126 via third tab 130, third tab 130 having an electrical cross-section 148 that is smaller than electrical cross-section 142 of second tab 128. In the illustrated exemplary embodiment spine portion spans second tab 128, third tab 130, and fourth tab 150.

Fourth tab 150 has a termination 152, a standoff portion 156, and an electrical cross-section 154. Termination 152 is connected electrically in series with supply portion 106 through third tab 150, second tab 128, and first tab 126. Electrical cross-section 154 is smaller than electrical cross-section 148 of third tab 130. Standoff portion 156 extends from fourth tab 150 for fixation of bus bar 100 to PWM body 204 (shown in FIG. 3). As will be appreciated by those of skill in the art in view of the present disclosure, bus bars having a distribution portion with four tabs allow for placement of two rows of four solid-state switch devices on PWB body 204 (shown in FIG. 3), conforming the function of PCB assembly 200 with that of legacy PWB assemblies. As will also be appreciated by those of skill in the art in view of the present disclosure, bus bar as described herein can have more than four tabs and fewer than four tabs and remain within the scope of the present disclosure, as suitable for an intended application.

Figure 5:
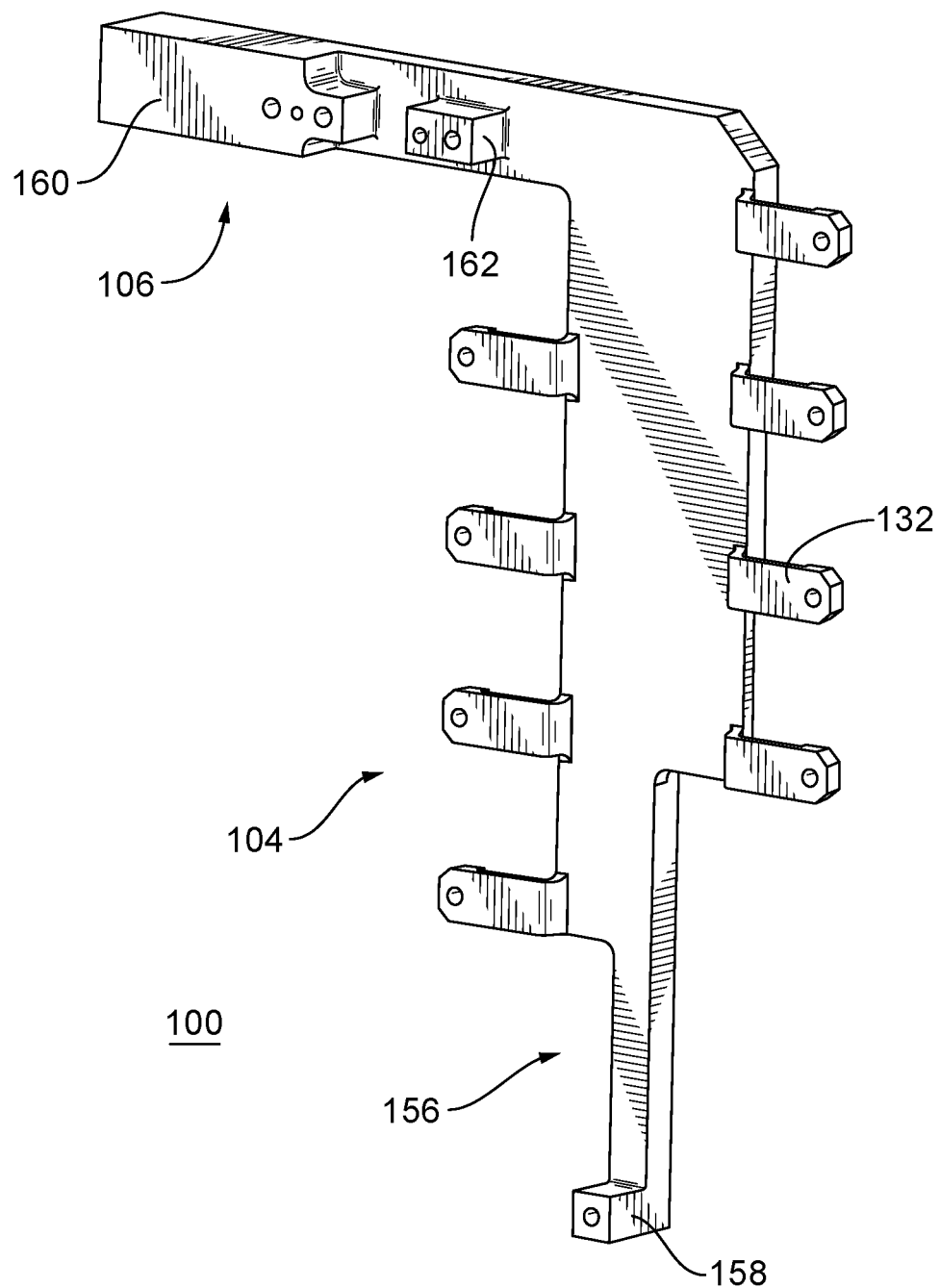

With reference to FIG. 5, a mounting surface of bus bar 100 is shown in a perspective view. Bus bar 100 has a plurality of standoffs arranged along a length of distribution portion 104 and supply portion 106. In this respect bus bar 100 has a standoff portion 156 connected electrically in series with socket contact 102 by the tabs of distribution portion 104, e.g., first tab 126 and second tab 128. Standoff portion 156 in turn has a distribution portion standoff 158 configured and adapted for mounting bus bar 100 to PWB body 204. A supply portion standoff 160 is arranged on standoff portion 156 of bus bar 100, is configured and adapted to mount bus bar 100 to PWB body 204, and cooperates with distribution portion standoff 158 to provide stiffness to PWB body 204. As will be appreciated by those of skill in the art in view of the present disclosure, providing stiffness to PWB body 204 reduces (or eliminates entirely) the need to provide a stiffener element to PWB body 204, reducing the weight of PWB assembly 200.

In the illustrated exemplary embodiment supply portion standoff 160 is co-located with socket contact 102 and supply portion 106 has an intermediate standoff 162. Intermediate standoff 162 is arranged along a length of bus bar 100 between supply portion standoff 160 and distribution portion standoff 158, increasing stiffness provided to PWB body 204. Further, it is contemplated that one of more of the tab terminations, e.g., termination 132, can be arranged to both electrically connect to a lead of a solid-state switch device and receive a fastener, further increasing the stiffness provided by bus bar 100 to PWB body 204. In the illustrated exemplary embodiment bus bar 100 includes 12 standoffs/terminations for mounting bus bar 100 to PWB body 204 and providing stiffness to PWB body 204. As will be appreciated by those of skill in the art in view of the present disclosure, bus bar 100 can have more than 12 standoffs/termination or fewer than 12 standoffs/terminations, as suitable for an intended application.

Figure 6:
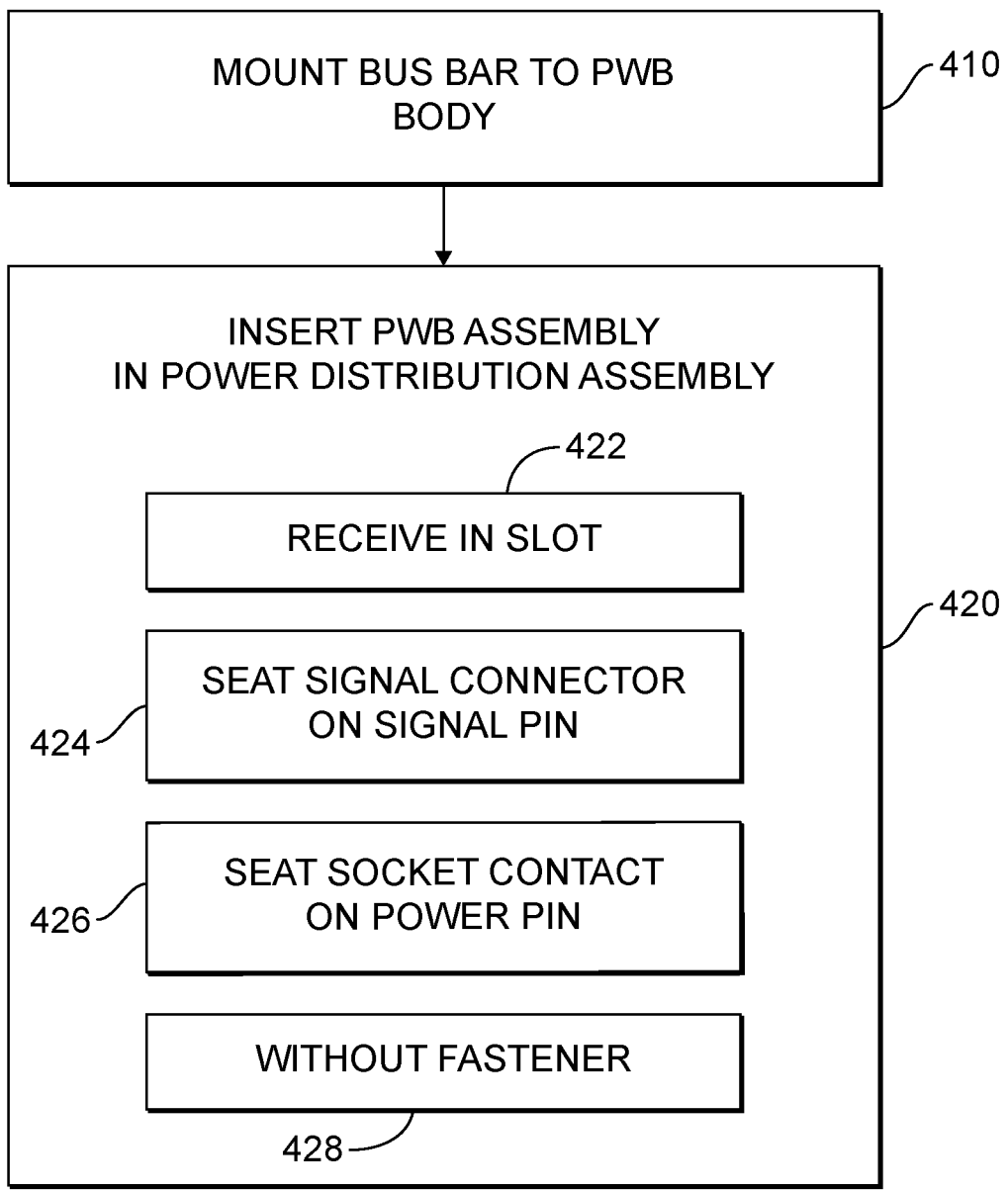
FIG. 6 is a block diagram of a method of making a power distribution assembly, showing steps for making the power distribution assembly without employing fasteners between a supply plug and PWB assembly-mounted bus bars.

With reference to FIG. 6, a method 400 of making a power distribution assembly is shown. Method 400 includes mounting a bus bar, e.g., bus bar 100 (shown in FIG. 1), to a PWB body, e.g., PWB body 202 (shown in FIG. 3), as shown with box 410. The PWB assembly, PWB assembly 200 (shown in FIG. 3), is inserted in a power distribution assembly, e.g., power distribution assembly 300 (shown in FIG. 2), as shown in box 420. The PWB assembly is received within a slot, e.g., card slot 308 (shown in FIG. 2), as shown in box 422. As the PWB assembly is received within the slot a signal connection located on the PWB body seats on a signal pin, as shown with box 424. Further, as the PWB assembly is received within the slot a socket contact, e.g., socket contact 102 (shown in FIG. 4), seats on a power pin for providing electrical power to the bus bar, as shown with box 426. The electrical connections are made without the use of a fastener, as shown with box 428.

The methods and systems of the present disclosure, as described above and shown in the drawings, provide for bus bars, PWB assemblies, and power distribution assemblies with superior properties including absence of joints between bus bar connection with the supply connector and the connections to respective solid-state switch device input leads. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A bus bar for a printed wiring board (PWB) assembly, comprising:
   a distribution portion; and
   a supply portion with a socket contact, wherein the socket contact is in electrical communication with the distribution portion without an intervening joint to limit electrical resistance between a supply plug seated in the socket contact and the distribution portion of the bus bar, wherein the distribution portion has a first tab and a second tab, the first tab connecting the second tab electrically in series with the socket contact and wherein the distribution portion further includes a spine portion extending along at least the second tab to stiffen a PWB assembly including the bus bar.

2. The bus bar as recited in claim 1, wherein the distribution portion is angled relative to the supply portion.

3. The bus bar as recited in claim 1, wherein the bus bar has an L-shaped body defined by the distribution portion and the supply portion of the bus bar.

4. The bus bar as recited in claim 1, wherein the supply portion and the socket contact have a length that is smaller than a length of the distribution portion.

5. The bus bar as recited in claim 1, wherein the second tab has an electrical cross-section that is smaller than an electrical cross-section of the first tab.

6. The bus bar as recited in claim 1, further comprising a first terminal extending from the first tab and a second terminal extending from the second tab.

7. The bus bar as recited in claim 1, further comprising a standoff portion connected in series with the socket contact by the second tab.

8. The bus bar as recited in claim 1, further comprising a socket standoff co-located with the socket contact on an end of the supply portion for mounting the bus bar to a PWB body.

9. The bus bar as recited in claim 1, further comprising an insulator body coupled to the bus bar for electrically insulating the bus bar from the external environment.

10. The bus bar as recited in claim 1, wherein the socket contact defines a plug receptacle having an aperture located on an end of the supply portion opposite the distribution portion, the plug receptacle tapering in width between the aperture and an interior of the socket contact.

11. The bus bar as recited in claim 10, further comprising a foil body disposed within the plug receptacle for electrically connecting the socket contact with a supply plug.

12. A PWB assembly, comprising:
   a PWB body with a tab end and a backplane end;
   a bus bar as recited in claim 1 mounted to the PWB body, wherein the socket contact is arranged at the backplane end of the PWB body for mating the socket connect with a supply plug in a power distribution assembly chassis;
   a first standoff arranged on a side of the distribution portion opposite the supply portion for mounting the bus bar to a PWB body;
   a second standoff arranged on a side of the first standoff opposite the distribution portion for mounting the bus bar to the PWM body;
   an intermediate standoff arranged on the supply portion between the socket and distribution portions for mounting the bus bar to a PWB body; and
   a socket contact standoff co-located with the socket contact on an end of the supply portion for mounting the bus bar to a PWB body.

13. The PWB assembly as recited in claim 12, wherein the bus bar has an L-shaped body defined by the distribution portion and the supply portion of the bus bar, wherein the supply portion and the socket contact have a length that is smaller than a length of the distribution portion, wherein the socket contact defines a plug receptacle having an aperture located on an end of the supply portion opposite the distribution portion, the plug receptacle tapering in width between the aperture and an interior of the socket contact, and wherein the distribution portion includes a spine portion extending along at least the second tab to stiffen the PWM assembly.

14. The PWB assembly as recited in claim 12, wherein the distribution portion has a first tab and a second tab, the first tab connecting the second tab electrically in series with the socket contact, wherein the second tab has an electrical cross-section that is smaller than an electrical cross-section of the first tab, and further comprising:
   a first terminal extending from the first tab and a second terminal extending from the second tab; and
   a standoff portion connected electrically in series with the socket contact by the second tab.

15. A power distribution assembly, comprising:
   a chassis with a backplane;

a supply plug located in the backplane of the chassis; and a PWB as recited in claim 12, the supply plug seated in the socket contact such that the distribution portion of the bus is in electrical communication with the supply plug without the use of fasteners between the bus bar and the backplane.

16. A bus bar for a printed wiring board (PWB) assembly, comprising:

a distribution portion;

a supply portion with a socket contact, wherein the socket contact is in electrical communication with the distribution portion without an intervening joint to limit electrical resistance between a supply plug seated in the socket contact and the distribution portion of the bus bar;

a first standoff arranged on a side of the distribution portion opposite the supply portion for mounting the bus bar to a PWB body;

a second standoff arranged on a side of the first standoff opposite the distribution portion for mounting the bus bar to the PWM body; and an intermediate standoff arranged on the supply portion between the socket portion and the distribution portion of the bus bar for mounting the bus bar to a PWB body.

* * * * *